May 3, 1960 O. L. MacSORLEY 2,935,626
TRANSISTOR SWITCHING CIRCUIT
Filed Feb. 25, 1957
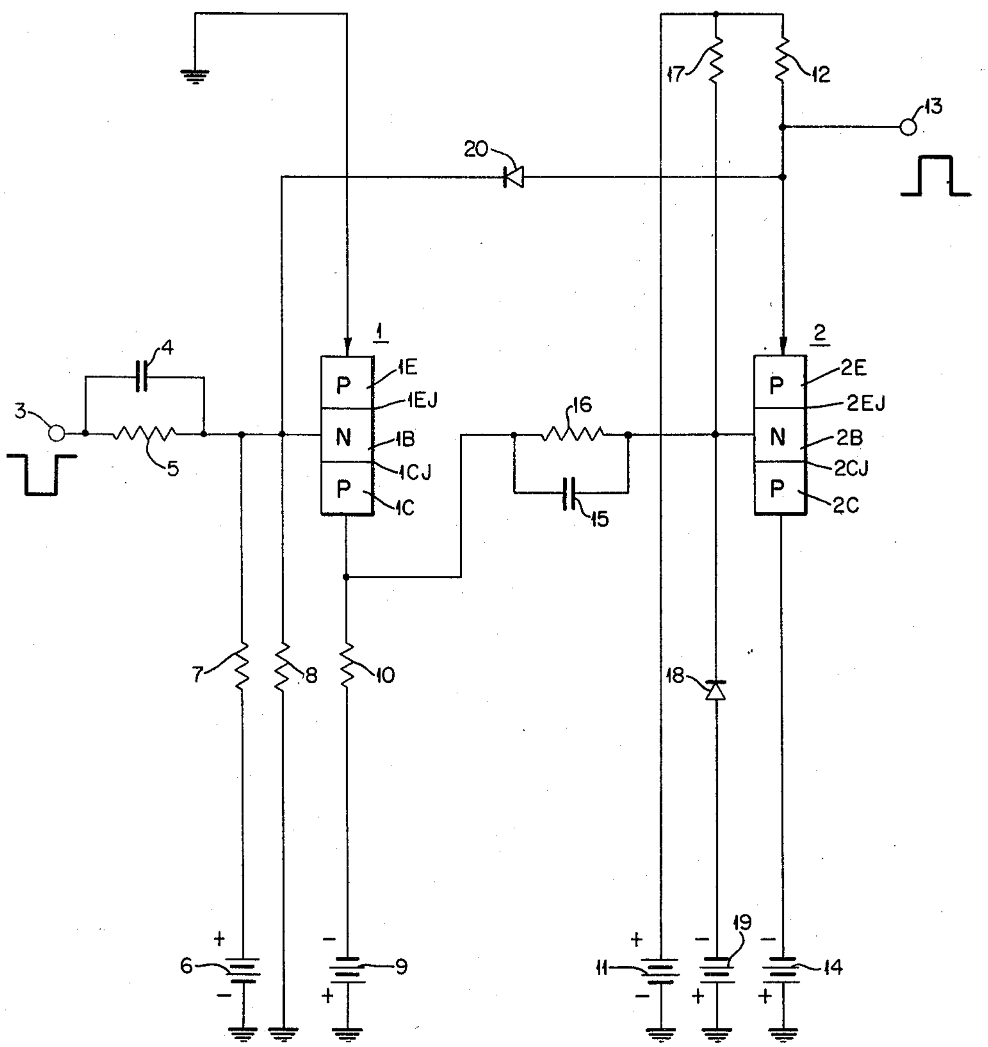
INVENTOR.
OLIN L. MAC SORLEY
BY Alvin J. Riddles
AGENT United States Patent Office 2,935,626
Patented May 3, 1960

2,935,626

TRANSISTOR SWITCHING CIRCUIT

Olin L. MacSorley, Poughkeepsie, N.Y., assignor to International Business Machines Corporation, New York, N.Y., a corporation of New York Application February 25, 1957, Serial No. 642,114

10 Claims. (Cl. 307—88.5)

This invention relates to transistor circuits wherein delays, particularly those resulting from minority carrier storage, and departures from desired output potential levels that are inherent in transistors, are minimized.

The criterion in switching circuits is a circuit that will provide at an output, a precise signal level with minimum delay, in response to the appearance at an input, of a signal having tolerances less critical than the output signal.

In transistor switching circuit design it has been the practice to use the potential level existing at a point in the circuit resulting from the "cut-off" condition of the transistor as one signal level and to use the potential level existing at a point in the circuit resulting from the saturation condition of the transistor as the other signal level. In operating circuits in this manner a limitation on speed has been encountered caused by a "turn off" delay due to minority carrier storage in the transistor as the circuit is turned off from the saturated condition. Further, in such transistor circuitry there are inherent forward transistor impedances that are responsible for a departure from a the desired signal level at the output.

What has been discovered is a two transistor switching circuit wherein the effect of "turn off" delay is overcome by providing a combination of circuit design and added components, the function of which, in addition to the reduction of delay, also serve to compensate for the inherent features of transistor circuits responsible for departures from desired output signal levels.

A primary object of this invention is to provide an improved transistor switching circuit having minimum input to output delay and departure from desired signal levels.

Another object is to provide an improved transistor inverter circuit.

A related object is to provide an improved transistor building block circuit.

Other objects of the invention will be pointed out in the following description and claims and illustrated in the accompanying drawing, which disclose, by way of example, the principle of the invention and the best mode, which has been contemplated, of applying that principle.

These objects are achieved by providing a two stage circuit comprising an inverter type input stage driving an emitter follower type output stage, wherein departure from desired output signal levels due to forward impedances of the transistors are compensated for by the control circuitry which also minimizes "turn off" delay. Such a circuit has the advantages of high speed, signal level establishment and the ability to reliably switch with deteriorated input signals. The circuit may be used in such applications as an inverter, an amplifier, a level setter, and may be cross-coupled in the Eccles-Jordan manner into a bistable trigger circuit, which in turn may be used as a building block for example in the formation of ring circuits, counters and shift registers. Further, in small signal applications the principle of the invention may be used to protect against the effects of spurious large magnitude pulses such as noise.

In the drawings:

The figure shows a two transistor inverter circuit illustrating the principle of this invention.

Referring now to the figure, a two transistor inverter circuit is shown comprising an input transistor 1 connected as an inverter type circuit and an output transistor 2 connected as an emitter follower type circuit. The inverter type and emitter follower type transistor circuits are well known in the art and have been described in copending applications Nos. 459,322 filed September 30, 1954, Patent No. 2,891,172, and 459,382 filed September 30, 1954, Patent No. 288,578, respectively, both assigned to the assignee of this invention. Transistor 1 has an emitter region 1E, a base region 1B and a collector region 1C. The emitter region 1E and the base region 1B are joined at a junction 1EJ and the base region 1B and the collector region 1C are joined at a junction 1CJ. Transistors 1 and 2 are shown for illustration purposes as PNP type, it being understood that NPN types may be substituted with proper circuit and polarity changes such as could readily be performed by one skilled in the art. The only requirement on the transistors is that they have a base to collector amplification factor, known as $\alpha'$ in the art, sufficient to overcome the load imposed by the circuitry. The emitter 1E of transistor 1 is connected to ground. An input terminal 3 is provided connected to the base 1B through pulse shaping capacitor 4 and current controlling resistor 5 in parallel in order to permit input signals to be impressed on the base 1B. The base 1B is also connected to a source of positive potential shown as battery 6 through resistor 7 for biasing purposes. The base 1B is also connected through a stabilizing device shown as resistor 8 to reference potential. The collector 1C is connected to a source of negative potential shown as battery 9 through resistor 10.

The transistor 2 comprises an emitter region 2E, a base region 2B and a collector region 2C separated by junctions 2EJ and 2CJ respectively. The emitter region 2E is connected to a source of positive potentials shown as battery 11 through resistor 12 and an output terminal 13 is provided for sensing potential excursions at the emitter 2E. The collector 2C is connected to a source of negative potential shown as battery 14. Signals developed at the collector 1C are impressed on the base 2B through capacitor 15 and resistor 16 in parallel and the limits of the potential excursion of the base 2B is established by the voltage divider comprising resistor 17 connected between battery 11 and the base 2B and diode 18 connected in the forward direction between a source of negative potential shown as battery 19 and the base 2B. Signals developed at the emitter 2E are coupled to the base 1B through diode 20 for purposes to be later explained.

In order to facilitate an understanding of the operation of the circuit of this invention the following set of actual values for the elements of the figure are presented. It should be understod that the principles of operation of this circuit may be present in circuits having a wide range of individual specifications so that the list of values here presented should not be construed as a limitation.

| | |
|---|---|
| Transistors 1 and 2 | Germanium PNP—$\alpha$=0.98—$f_{co}$=1.0 megacycle for example GE type 2N43. |
| Diodes 18 and 20 | Germanium junction for example Sylvania type 1N34. |
| Resistor 5 | 9.1 K ohms. |
| Resistor 7 | 51 K ohms. |

| | |
|---|---|
| Resistor 8 | 6.4 K ohms. |
| Resistor 10 | 3.0 K ohms. |
| Resistor 16 | 1.0 K ohms. |
| Resistor 12 | 1.0 K ohms. |
| Resistor 17 | 10 K ohms. |
| Capacitors 4 and 15 | 470 micromicrofarads. |
| Battery 6 | +10 volts. |
| Battery 9 | −15 volts. |
| Battery 11 | +10 volts. |
| Battery 14 | −6.5 volts. |
| Battery 19 | −5 volts. |

Under the above conditions, in operation in the no signal condition, transistor 1 is cut off and transistor 2 is conducting. Transistor 1 is cut off because the potential level of the base 1B, which is established by the current flowing through resistors 7 and 8 in series between battery 6 and reference potential and the back currents through the junctions 1EJ and 1CJ, is positive with respect to the emitter 1E and hence the junction 1E is reverse biased. Under these conditions the collector 1C potential will approach the −15 volt negative potential of battery 9. This potential level is coupled through capacitor 15 and resistor 16 in parallel to the base 2B of transistor 2 and causes the potential of the base 2B to be established by a current flowing from the −5 volt level of battery 19 through diode 18, resistors 16 and 10 to the greater, −15 volt, negative potential of battery 9. As a result the potential level of base 2B is at a point slightly negative of the −5 volts of battery 19 by the forward potential difference across diode 18. Since transistor 2 is connected as an emitter follower type circuit the potential level at emitter 2E and consequently at the output terminal 13 will be very close to the potential at the base 2B, namely −5 volts for this illustration. The exact potential level at the output terminal 13 is the potential level of the base 2B minus the forward potential difference between the emitter 2E and the base 2B of transistor 2. Since the potential of the base 2B was established above the −5 volts plus the forward potential drop across diode 18 it will be apparent that the actual potential level of the output terminal 13 will depart from the desired −5 volts only by the difference in potential drop in the forward direction between that of diode 18 and that of the emitter 2E to base 2B of transistor 2. With the output terminal 13 at −5 volts and the input terminal 3 at 0 volt the diode 20 is cut off. Thus, it may be seen that for this input the departure from the desired output signal level due to the inherent forward impedances of transistors are kept to a minimum in the circuit of this invention by internal compensation and that as a result a very closely controlled output is maintained. In the signal condition the potential level at input terminal 3 moves to a negative value sufficient to overcome the reverse bias on emitter junction 1E and conduction takes place through transistor 1. The input signal need only be large enough to supply sufficient base current to cause transistor 1 to approach saturation. Through adjustment of current limiting resistor 5 and resistors 7 and 8 a wide range of input signal levels may be tolerated. With current flowing through transistor 1, the current flowing through resistor 10 raises the potential level at the collector 1C toward the potential of the emitter 1E, which in this illustration is ground. The potential rise at 1C is coupled through capacitor 15 and resistor 16 in parallel and is impressed on the base 2B of transistor 2. At this point, if the potential at collector 1C were permitted to more closely approach the potential of emitter 1E than the potential of the base 1B, a condition which may occur due to the low forward potential drop of a transistor between emitter and collector, transistor 1 would be saturated, a condition of minority carrier storage in the base would exist, and turn off delay would result. To avoid this condition certain of the elements of the circuit of this invention perform a different function in this phase of the operation. Under these conditions the potential at the base 2B is determined by the combination of resistors 16 and 17 serving as a voltage dividing network between the potential of battery 11 and the potential of collector 1C, as a result, so long as resistor 16 has a finite value, the base 2B will in this stage of the operation be positive with respect to collector 1C. The emitter 2E will be positive with respect to the base 2B by the forward emitter to base potential difference across transistor 2 and this potential is impressed through diode 20 on the base 1B thereby maintaining it positive with respect to collector 1C and keeping transistor 1 out of saturation.

The potential at the output terminal 13 in the signal condition departs from 0 volt for this particular illustration by the forward potential difference from emitter to base of transistor 1 minus the forward potential difference across diode 20. It should then be apparent that in the switching circuit of this invention in both the signal and no signal conditions the output potential internal circuit compensation results in a very closely controlled output signal level. In this particular illustration, for an input signal magnitude of −5 volts applied at terminal 3, the potential at the base 1B will approach −0.2 volt, and, when the potential at the emitter 2E becomes positive with respect to this, diode 20 will conduct, thereby reducing the base current at 1B and hence the collector current at 1C. This will result in an equilibrium condition being set up wherein the potential at 1C will be kept at a value such that 2E will be positive with respect to it, thus diode 20 will conduct and control the base current at 1B to a value whereby transistor 1 will be kept out of saturation and the potential level at 2E will depart from ground only by the difference between the forward potential drop across diode 20 and the forward potential drop from emitter to base of transistor 1.

What has been described is a self controlling and compensating transistor switching circuit wherein the problem of "turn off" delay is maintained at a minimum by components the function of which is not only to control the circuit operation by avoiding saturation but also to compensate for features inherent in transistors that tend to cause a departure from the desired output signal levels. These features have been illustrated as being achieved through the use of asymmetric impedances for signal translation and clamping; and the forward impedances of these asymmetric impedances add algebraically to the inherent forward impedances of the active elements in the circuits so as to compensate for changes in output signal level due to these inherent impedances. It should be noted then that considerable circuit variation may be practiced while still employing the basic principle and spirit of the invention. For example referring to the figure diode 18 may be connected to any point in the circuit whereby the forward potential difference across it will establish at the base 2B, a departure from the desired output potential level, in the opposite direction from the departure received by the inherent emitter to base potential difference of transistor 2 itself. Further, it should be noted that the potential level to which the emitter 1E is connected determines the maximum signal level in one direction and the potential of battery 19 determines the potential level in the other direction, so that the circuit of this invention may easily be caused to operate between any desired set of signal levels by returning the emitter 1E to one of the desired levels and by providing battery 19 as the other level, any necessary proportional changes being made in the other voltage levels.

While the circuit has been described as having controlling advantages for both output signal levels and saturation control it is possible by the elimination of certain control components to achieve a superior circuit using the principle of the invention having some but not all the described advantages. For example, the elimination of diode 18 will cause potential 14 instead of potential 19 to determine the lower level at the output terminal B. This will retain the level setting properties, but will allow minority carrier storage in transistor 2 when transistor 1 is not conducting current. This results from the fact that in this condition the emitter base junction 2CJ acts as a clamp diode in place of diode 18, and under this condition can produce minority carrier storage.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims:

What is claimed is:

1. A transistor circuit comprising in combination an input transistor including emitter, base and collector regions operatively associated therewith, means including an emitter and collector return potential providing current flow between said emitter and said collector of said input transistor, means including a source of potential connected to said base of said input transistor operative to prevent current flow from emitter to collector of said input transistor, an output transistor including emitter, base and collector electrodes, means including an emitter and collector return potential providing current flow from emitter to collector of said output transistor, means coupling the potential of the collector of said input transistor to the base of said output transistor, means limiting the potential excursion of said base of said output transistor in the direction of the collector return potential of said input transistor, potential level shifting means operable to translate the potential at the collector of said input transistor in the direction of said emitter return potential of said output transistor, control means operable to apply the potential at the emitter of said output transistor to the base of said input transistor said means including an asymmetric impedance having high and low impedance condition so connected as to be in the high impedance condition when current is not flowing from emitter to collector of said input transistor, signal input means connected to the base of said input transistor and operable to overcome said means preventing current flow between emitter and collector of said input transistor and means for delivering signals present at the emitter of said output transistor.

2. The circuit of claim 1 wherein said means limiting the potential excursion of said base of said output transistor includes an asymmetric impedance so connected that the forward impedance therethrough is effective in the signal condition to compensate for the effect of the emitter to base forward impedance of said output transistor.

3. The circuit of claim 1 wherein said input and said output transistors are PNP type transistors.

4. The circuit of claim 1 wherein said input and said output transistors are NPN type transistors.

5. A transistor circuit comprising in combination a first transistor of one conductivity type including emitter, base and collector electrodes, said emitter of said first transistor being connected to a first reference potential, a first resistor having one terminal thereof connected to said collector of said first transistor a first potential source having one terminal thereof connected to the remaining terminal of said first resistor and having the remaining terminal thereof connected to said first reference potential and operative to provide current flow through said first transistor, biasing means connected to said base of said first transistor and operative to prevent current flow through said first transistor, signal input means connected to the base of said first transistor and operative in the presence of input signals to overcome said biasing means, a second transistor of the same conductivity type as said first transistor including emitter, base and collector electrodes, a second potential source having one terminal thereof connected to the collector of said second transistor having the remaining terminal connected to said first reference potential and operative to provide current flow through said second transistor, a second resistor having one terminal thereof connected to the emitter connection of said second transistor, a third potential source having one terminal thereof connected to the remaining terminal of said second resistor the remaining terminal thereof being connected to said first reference potential and operative to provide current flow through said second transistor, coupling means for impressing signals developed at the collector of said first transistor on the base of said second transistor said coupling means including translating means for moving the potential level of signals developed at the collector of said first transistor in the direction of the potential of said third potential source, a first asymmetric impedance having one terminal thereof connected to the base of said second transistor and having the remaining terminal thereof connected to a second reference potential, said first asymmetric impedance being so connected that it is in its low impedance condition when said first transistor is not conducting current; a second symmetric impedance having on terminal thereof connected to the emitter of said second transistor and having the remaining terminal thereof connected to the base of said first transistor, said second asymmetric impedance being so connected as to be in the high impedance condition when current is not flowing from emitter to base of said first transistor and means for delivering signals present at the emitter of said output transistor.

6. The circuit of claim 5 wherein said first and said second transistors are PNP types.

7. The circuit of claim 5 wherein said first and said second transistors are NPN types.

8. A transistor circuit comprising in combination an inverter type transistor amplifier input stage having input, output and control connections connected to an emitter follower type transistor amplifier output stage having input, output and control connections, coupling means coupling the collector of said inverter stage to the base of said emitter follower stage said coupling means including further means translating signals appearing at the collector of said inverter stage in the direction of the emitter return potential of said emitter follower stage, means limiting the maximum potential excursion of the base of said emitter follower stage in the direction opposite to said emitter return potential of said emitter follower stage and feedback means coupling the emitter of said emitter follower stage to the base of said inverter stage said feedback means including an asymmetric impedance so connected as to be in the high impedance condition when said inverter stage is not translating a signal.

9. The transistor circuit of claim 8 wherein said input and said output stages employ PNP type transistors.

10. The transistor circuit of claim 8 wherein said input and said output stages employ NPN type transistors.

References Cited in the file of this patent

UNITED STATES PATENTS

| | | |
|---|---|---|
| 2,703,368 | Wrathall | Mar. 1, 1955 |
| 2,814,736 | Hamilton | Nov. 26, 1957 |
| 2,825,822 | Huang | Mar. 4, 1958 |
| 2,828,450 | Pinckaers | Mar. 25, 1958 |

FOREIGN PATENTS

| | | |
|---|---|---|
| 755,797 | Great Britain | Aug. 29, 1956 |
| 1,116,599 | France | Feb. 6, 1956 |
| 1,119,708 | France | Apr. 9, 1956 |

UNITED STATES PATENT OFFICE

CERTIFICATE OF CORRECTION

May 3, 1960

Patent No. 2,935,626

Olin L. MacSorley

It is hereby certified that error appears in the printed specification of the above numbered patent requiring correction and that the said Letters Patent should read as corrected below.

Column 2, line 14, for "Patent No. 288,578" read -- Patent No. 2,888,578 --; column 4, line 49, for "circuits" read -- circuit --; column 6, line 27, for "symmetric" read -- asymmetric --.

Signed and sealed this 4th day of October 1960.

(SEAL)

Attest:

KARL H. AXLINE

Attesting Officer

ROBERT C. WATSON

Commissioner of Patents